United States Patent
Gero et al.

(10) Patent No.: US 8,574,721 B2
(45) Date of Patent: Nov. 5, 2013

(54) LAYERED THERMAL BARRIER COATING WITH BLENDED TRANSITION AND METHOD OF APPLICATION

(71) Applicant: United Technologies Corporation, Hartford, CT (US)

(72) Inventors: Peter F. Gero, Portland, CT (US); Kevin W. Schlichting, South Glastonbury, CT (US); James W. Neal, Ellington, CT (US)

(73) Assignee: United Technologies Corporation, Hartford, CT (US)

( * ) Notice: Subject to any disclaimer, the term of this patent is extended or adjusted under 35 U.S.C. 154(b) by 25 days.

(21) Appl. No.: 13/674,435

(22) Filed: Nov. 12, 2012

(65) Prior Publication Data
US 2013/0065048 A1    Mar. 14, 2013

Related U.S. Application Data

(62) Division of application No. 12/781,485, filed on May 17, 2010, now Pat. No. 8,337,989.

(51) Int. Cl.
*B32B 9/04*    (2006.01)
*C23C 16/50*    (2006.01)
*B32B 15/04*    (2006.01)

(52) U.S. Cl.
USPC ........... 428/610; 428/633; 428/332; 428/472; 428/697; 428/337; 428/547; 428/629; 428/701; 428/702; 428/650; 428/651; 416/241 R; 416/241B

(58) Field of Classification Search
None
See application file for complete search history.

(56) References Cited

U.S. PATENT DOCUMENTS

| | | |
|---|---|---|
| 3,912,235 A | 10/1975 | Janssen |
| 4,401,697 A | 8/1983 | Strangman |
| 4,481,237 A | 11/1984 | Bosshart et al. |
| 4,588,607 A | 5/1986 | Matarese et al. |
| 4,603,257 A | 7/1986 | Packer et al. |
| 4,613,259 A | 9/1986 | Packer et al. |
| 5,705,231 A | 1/1998 | Nissley et al. |
| 5,780,171 A | 7/1998 | Nissley et al. |

(Continued)

FOREIGN PATENT DOCUMENTS

| | | |
|---|---|---|
| EP | 0765951 A2 | 4/1997 |
| EP | 1593752 A2 | 11/2005 |

(Continued)

OTHER PUBLICATIONS

Extended European Search Report for EP Application No. 11250422.0, filed on Apr. 4, 2011.

*Primary Examiner* — Vera Katz
(74) *Attorney, Agent, or Firm* — Kinney & Lange, P.A.

(57) ABSTRACT

A multilayer coating includes a bond coat layer, a first barrier layer applied on the bond coat layer, and a second barrier layer applied on the first barrier layer. The first barrier layer has a compositional gradient comprising a majority of a first rare earth stabilized zirconia material proximate the bond coat layer to a majority of a second rare earth stabilized zirconia material away from the bond coat layer. The first and second rare earth stabilized zirconia materials are different. The second barrier layer has a compositional gradient comprising a majority of the second rare earth stabilized zirconia material to 100 wt % of a third rare earth stabilized zirconia material away from the first barrier layer.

13 Claims, 2 Drawing Sheets

(56) References Cited

U.S. PATENT DOCUMENTS

| | | | |
|---|---|---|---|
| 5,792,521 A | 8/1998 | Wortman | |
| 5,942,334 A | 8/1999 | Wortman | |
| 6,054,184 A | 4/2000 | Bruce et al. | |
| 6,102,656 A | 8/2000 | Nissley et al. | |
| 6,187,453 B1 | 2/2001 | Maloney | |
| 6,284,323 B1 | 9/2001 | Maloney | |
| 6,503,574 B1 | 1/2003 | Skelly et al. | |
| 6,589,351 B1 | 7/2003 | Bruce et al. | |
| 6,620,465 B2 | 9/2003 | Rigney et al. | |
| 6,863,937 B2 | 3/2005 | Bruce et al. | |
| 6,946,035 B2 | 9/2005 | Suzuki | |
| 6,983,718 B1 | 1/2006 | Bruce et al. | |
| 7,128,950 B2 | 10/2006 | Bruce et al. | |
| 7,229,701 B2 | 6/2007 | Madhava et al. | |
| 7,291,403 B2 * | 11/2007 | Nagaraj et al. | 428/632 |
| 7,326,470 B2 | 2/2008 | Ulion et al. | |
| 7,413,808 B2 | 8/2008 | Burd et al. | |
| 7,422,771 B2 | 9/2008 | Pietraszkiewicz et al. | |
| 7,622,195 B2 | 11/2009 | Schlichting et al. | |
| 8,241,815 B2 * | 8/2012 | Kuo et al. | 429/483 |
| 8,293,429 B2 * | 10/2012 | Devoe et al. | 429/535 |
| 2003/0003318 A1 | 1/2003 | Spitsberg et al. | |
| 2003/0008167 A1 | 1/2003 | Loch et al. | |
| 2003/0064234 A1 * | 4/2003 | Payne et al. | 428/469 |
| 2003/0118873 A1 * | 6/2003 | Murphy | 428/701 |
| 2003/0224124 A1 * | 12/2003 | Lau et al. | 427/454 |
| 2005/0031891 A1 | 2/2005 | Kaiser et al. | |
| 2005/0137084 A1 * | 6/2005 | Krisko et al. | 502/349 |
| 2007/0082131 A1 | 4/2007 | Doesburg et al. | |
| 2007/0141233 A1 | 6/2007 | Schlichting et al. | |
| 2007/0160873 A1 | 7/2007 | Freling et al. | |
| 2007/0172703 A1 | 7/2007 | Freling et al. | |
| 2008/0026248 A1 * | 1/2008 | Balagopal et al. | 428/688 |
| 2008/0113218 A1 | 5/2008 | Schlichting et al. | |
| 2008/0166489 A1 | 7/2008 | Strock et al. | |
| 2008/0176097 A1 | 7/2008 | Schlichting et al. | |
| 2008/0199709 A1 | 8/2008 | Ishiwata et al. | |
| 2009/0191422 A1 | 7/2009 | Tryon et al. | |
| 2010/0028549 A1 | 2/2010 | Schlichting et al. | |
| 2010/0028698 A1 | 2/2010 | Schlichting et al. | |
| 2010/0047075 A1 | 2/2010 | Schlichting et al. | |
| 2010/0196605 A1 | 8/2010 | Schlichting et al. | |
| 2010/0311562 A1 * | 12/2010 | Xie et al. | 501/103 |
| 2012/0003571 A1 * | 1/2012 | Devoe et al. | 429/535 |

FOREIGN PATENT DOCUMENTS

| | | |
|---|---|---|
| EP | 1642993 A1 | 4/2006 |
| EP | 1811061 A2 | 7/2007 |
| EP | 1889948 A2 | 2/2008 |
| EP | 1967602 A2 | 9/2008 |
| EP | 2014784 A2 | 1/2009 |
| JP | 2001 279418 | 10/2001 |
| JP | 2001 348655 | 12/2001 |
| JP | 2005 002409 | 6/2003 |
| JP | 2005 313644 | 11/2005 |
| JP | 2006 045606 | 2/2006 |
| JP | 2006 124226 | 5/2006 |
| JP | 2007 211343 | 8/2007 |
| WO | WO00/09778 A1 | 2/2000 |

* cited by examiner

LAYERED THERMAL BARRIER COATING WITH BLENDED TRANSITION AND METHOD OF APPLICATION

CROSS-REFERENCE TO RELATED APPLICATION(S)

The present application is a divisional of U.S. patent application Ser. No. 12/781,485, filed May 17, 2010, which is hereby incorporated by reference in its entirety.

BACKGROUND

The present invention relates to coating apparatuses and methods of applying coatings.

Coatings are utilized in a variety of settings to provide a variety of benefits. For example, modern gas turbine engines can include thermal barrier coatings (TBCs), environmental coatings, etc. to help promote efficient and reliable operation. Conventional electron beam physical vapor deposition (EB-PVD) and plasma-based PVD techniques used to create multilayer ceramic coatings are plagued by undesirable transition effects between layers, such as crystallographic defects that occur when coating growth is stopped and re-started and mechanical property discontinuities associated with sharp transitions from one type of ceramic to another (e.g., coefficient of thermal expansion discontinuities). These transition effects can limit a service life of the coating.

One prior art coating involved plasma spraying to deposit powdered coating material on a blade outer air seal (BOAS). According to that process, the coating material was deposited as a stream of liquid droplets. The coating was deposited on the parent material of the BOAS using continuous plasma spraying (in liquid droplet form) to form a bond coat of Nickel-Chromium/Aluminum, followed by a layer with a gradient of Cobalt-Chromium-Aluminum-Yttrium alloy and Alumina, followed by another layer with a gradient of Alumina and Yttria-stabilized Zirconia, and followed by another layer of either (a) Yttria Zirconia aromatic polyester blend or (b) Yttria-stabilized Zirconia plus Silicon or simply Yttria-stabilized Zirconia blended with an aromatic polyester material. Such a coating and an associated application method are described in U.S. Pat. Nos. 4,481,237, 4,588,607, 4,603,257 and 4,613,259.

SUMMARY

A multilayer coating includes a bond coat layer, a first barrier layer applied on the bond coat layer, and a second barrier layer applied on the first barrier layer. The first barrier layer has a compositional gradient comprising a majority of a first rare earth stabilized zirconia material proximate the bond coat layer to a majority of a second rare earth stabilized zirconia material away from the bond coat layer. The first and second rare earth stabilized zirconia materials are different. The second barrier layer has a compositional gradient comprising a majority of the second rare earth stabilized zirconia material to 100 wt % of a third rare earth stabilized zirconia material away from the first barrier layer.

DETAILED DESCRIPTION

In general, the present invention provides a coating suitable for use as a thermal barrier coating (TBC) for gas turbine engine components, as well as a method of application of the coating. The coating can be a multilayer coating including a bond coat applied to parent material of the work piece and one or more barrier layers having a compositional gradient that produces blended transitions between layers. The barrier layers can each be made of ceramic materials, inert compounds with cubic crystalline structures, or other materials as desired for particular applications. The resultant coating can have a columnar microstructure. Coating materials can be deposited on the work piece in a vapor-based plasma stream using a plasma gun. The work piece can be rotated during the coating deposition process.

Figure 1:
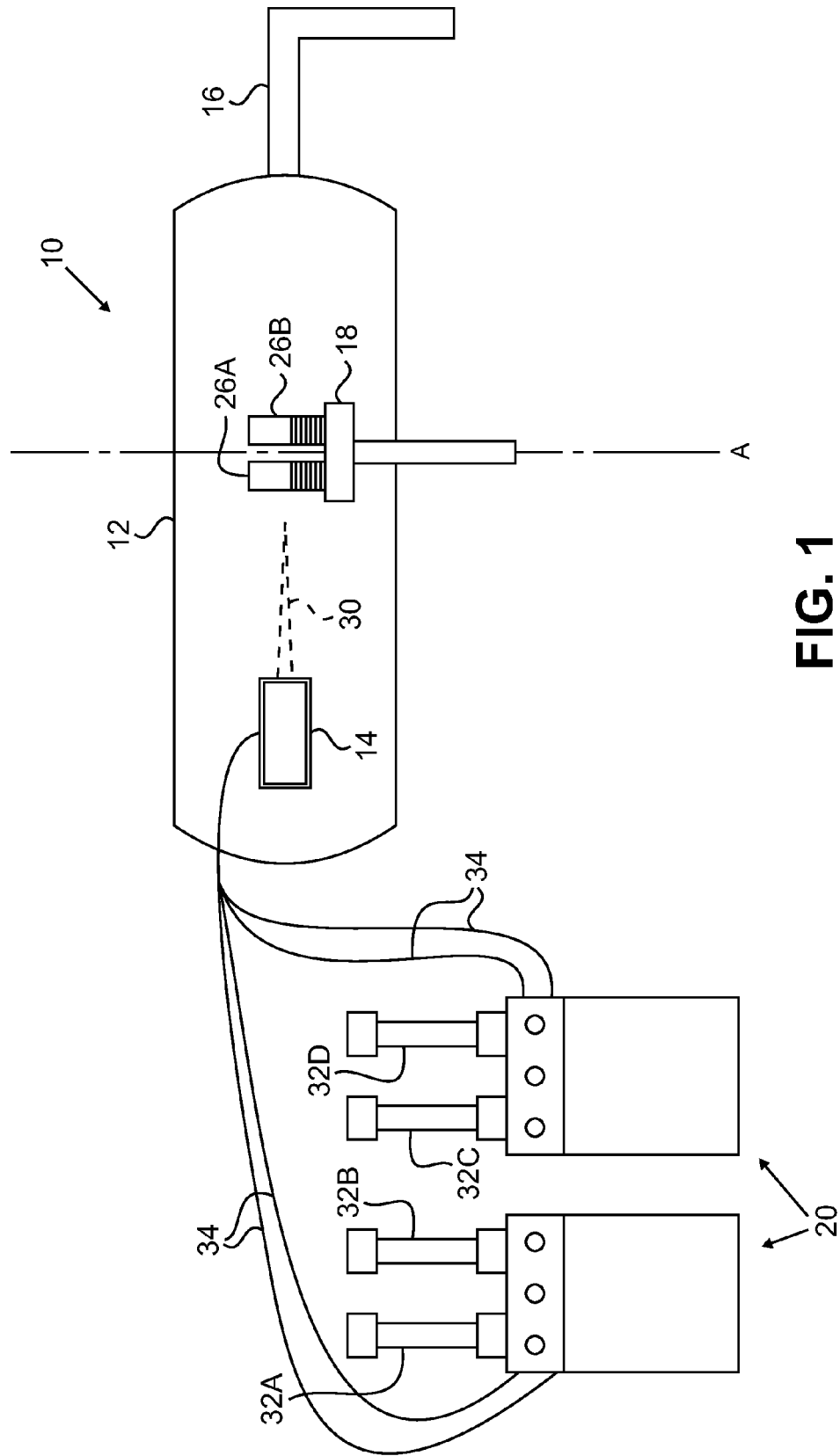
FIG. 1 is a schematic cross-sectional view of a coating apparatus according to the present invention.

FIG. 1 is a schematic illustration of one embodiment of a coating apparatus 10 that includes a process chamber 12, a plasma gun 14, a pumping assembly 16, a work piece support fixture 18, and one or more coating material supply assemblies 20. One or more work pieces 26A and 26B (collectively referred to by reference number 26) desired to be coated can be secured to the work piece support fixture 18. In the illustrated embodiment, the work pieces 26 are turbine blades for a gas turbine engine, though it will be understood that the work pieces 26 can be nearly any type of component in further embodiments.

The process chamber 12 provides a contained environment for application of coating materials to the work pieces 26. In the illustrated embodiment, the process chamber 12 includes fluid-cooled walls, which can be cooled with water at approximately 15-20° C. (60-70° F.). The process chamber 12 defines an interior space that is held in a vacuum (i.e., a partial vacuum), with the vacuum in the range of approximately 66.66 Pa (0.5 Torr) to approximately 1.33 kPa (10 Torr). Suitable thermal management equipment (not shown), such as passive thermal insulation, thermal reflectors and heater elements, can be provided in the process chamber 12 as desired. For example, some suitable thermal management systems and methods are disclosed in commonly-assigned and co-pending U.S. patent application Ser. Nos. 12/723,405, 12/723,412 and 12/723,436, which are all hereby incorporated by reference in their entireties.

The plasma gun 14 is typically positioned within the process chamber 12. The plasma gun 14 can be of a known type that produces a plasma plume (or jet) into which a coating material, such as a coating material powder (which can be a mixture of more than one discrete type of coating material powder), is introduced to produce a stream 30 that includes the coating material in a vapor phase. The stream 30 is directed toward the work pieces 26A and 26B and the work piece support fixture 18 to provide plasma-based physical vapor deposition (PVD) coating application. During operation, the plasma gun 14 generates thermal energy within the process chamber 12, with temperatures typically ranging from approximately 871-1093° C. (1600-2000° F.) near the work pieces 26A and 26B, depending on the type of gun, and stand-off distance. Optimal coating process temperatures can vary for different coating materials. Moreover, in alternative embodiments, a different type of coating supply and delivery apparatus can be substituted for the plasma gun 14, as desired for particular applications.

Excess coating material, that is, coating material not deposited on the work pieces 26, can be cooled and collected by the pumping assembly 16. In the illustrated embodiment, the pumping assembly is of a conventional configuration that allows for extraction and collection of excess coating material from the process chamber 12, as well as cooling of that excess coating material. The pumping assembly 16 is typically located at an end of the process chamber opposite the plasma gun 14.

In the illustrated embodiment, the work pieces 26A and 26B desired to be coated are each secured to the work piece support fixture 18 in the path of the stream 30, downstream from the plasma gun 14. The work piece support fixture 18 can selectively index the work pieces 26 relative to the stream 30 and the plasma gun 14, which typically has a fixed orientation, in order to expose different portions of the work pieces 26 to the stream 30 in a uniform manner so that the coating material can cover all sides of the work pieces 26 substantially equally. In one embodiment, the work piece support fixture 18 is configured to rotate the work pieces 26 about a central axis A. In alternative embodiments, more complex movements of the work pieces 26 are possible, such as planetary- or rotisserie-type movement.

The one or more coating material supply assemblies 20 can supply a plurality of different coating materials to the plasma gun 14 for delivery with the stream 30. In the illustrated embodiment, two coating material supply assemblies 20 are provided that include a total of four powder feeders 32A-32D each providing separate material feedstock. The powder feeders 32A-32D are configured to supply coating material in powdered form through supply lines 34 to the plasma gun 14 for melting (e.g., vaporization) and delivery by the stream 30. The powder feeders 32A-32D are independently operable, which allows for one or more of the powder feeders 32A-32D to operate simultaneously and for a supply rate of each of the powder feeders 32A-32D to be independently controlled. This allows the rate of delivery of individual coating materials to be increased and decreased independently through control of the powder feeders 32A-32D. Coating materials from the powder feeders 32A-32D can be mixed prior to vaporization. Mixing can occur in the supply lines 34, in a mixing manifold (not shown), such as one of a type disclosed in U.S. Pat. No. 4,613,259, or in any other suitable manner. In this way, coating materials can be applied by the apparatus 10 with varying coating material compositions without stopping and re-starting coating deposition. In alternative embodiments, coating materials can be provided in a form other than powdered form with suitable feeder and supply assemblies utilized for the particular form of the coating material to be applied.

Vapor-phase deposition processes are less prone to variation in makeup of the resultant coating on the work pieces 26 than liquid droplet application processes. This is due at least in part to turbulence in the stream 30.

Figure 2:
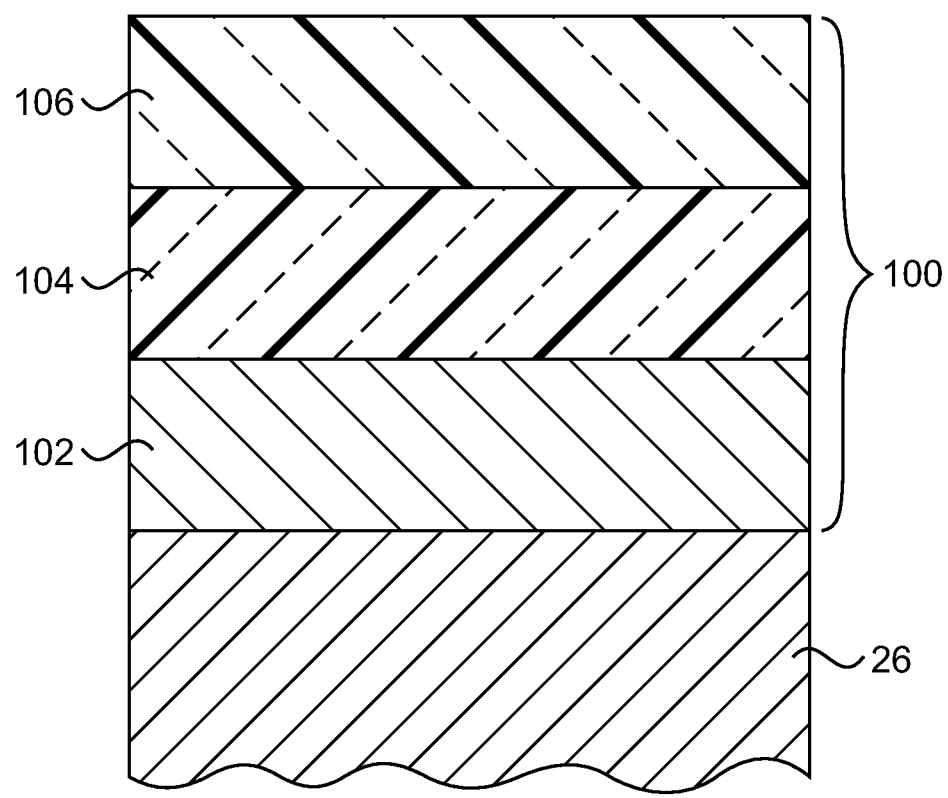
FIG. 2 is a cross-sectional view of a multilayer coating applied to a work piece according to the present invention.

FIG. 2 is a cross-sectional view of a multilayer coating 100 applied to a work piece 26. The multilayer coating 100 can be applied using the plasma-based PVD method an apparatus described with respect to FIG. 1, or other with other suitable processes. The work piece 26 can be made of a metallic parent material (also referred to herein as a substrate), such as a nickel- or cobalt-based superalloy, or any other metallic material desired for a particular application.

The multilayer coating 100 includes a bond coat layer 102 positioned directly on the parent material of the work piece 26. A first barrier layer 104 is positioned on the bond coat layer 102, and a second barrier layer 106 is positioned on the first barrier layer 104. In the illustrated embodiment, the second barrier layer 106 is the outermost layer of the multilayer coating 100, and the first barrier layer 104 is located in between the bond coat layer 102 and the second barrier layer 106. In further embodiments, the bond coat layer 102 and/or the second barrier layer 106 can be omitted. For simplicity of illustration, the coating 100 as shown in FIG. 2 has clear divisions between the illustrated layers. However, transitions between layers of the coating 100 can be blended such that transitions between layers are less distinct, or even indistinguishable. Moreover, although the layers of the coating 100 illustrated in FIG. 2 appear homogenous, the illustrated layers can have compositional gradients, as discussed below.

The bond coat layer 102 will include an adherent layer, typically an alumina layer, and can be made of a MCrAlY material, where M represents a metal such as Ni, Co or Co/Ni, or an aluminide (with or without Pt or other metals) or other suitable material. The first and second barrier layers 104 and 106 can be TBC materials, such as ceramic materials (e.g., rare-earth stabilized zirconia materials), environmental coatings, and/or inert compounds (e.g., compounds with a cubic crystalline structure such as any suitable garnet materials and/or a hexagonal crystalline structure such as an suitable oxyapatite materials, as described in commonly-assigned U.S. Pat. No. 7,622,195).

Garnet materials generally have the formula $$A_3B_2X_3O_{12} \quad (I)$$

where A comprises at least one of the elements selected from the group consisting of $Ca^{+2}$, $Gd^{+3}$, $In^{+3}$, $Mg^{+2}$, $Na^+$, $K^+$, $Fe^{+2}$, $La^{+2}$, $Ce^{+2}$, $Pr^{+2}$, $Nd^{+2}$, $Pm$, $Sm^{+2}$, $Eu^{+2}$, $Gd^{+2}$, $Tb^{+2}$, $Dy^{+2}$, $Ho^{+2}$, $Er^{+2}$, $Tm^{+2}$, $Yb^{+2}$, $Lu^{+2}$, $Sc^{+2}$, $Y^{+2}$, $Ti^{+2}$, $Zr^{+2}$, $Hf^{+2}$, $V^{+2}$, $Ta^{+2}$, $Cr^{+2}$, $W^{+2}$, $Mn^{+2}$, $Tc^{+2}$, $Re^{+2}$, $Fe^{+2}$, $Os^{+2}$, $Co^{+2}$, $Ir^{+2}$, $Ni^{+2}$, $Zn^{+2}$, and $Cd^{+2}$; where B comprises at least one of the elements selected from the group consisting of $Zr^{+4}$, $Hf^{+4}$, $Gd^{+3}$, $Al^{+3}$, $Fe^{+3}$, $La^{+2}$, $Ce^{+2}$, $Pr^{+2}$, $Nd^{+2}$, $Pm^{+2}$, $Sm^{+2}$, $Eu^{+2}$, $Gd^{+2}$, $Tb^{+2}$, $Dy^{+2}$, $Ho^{+2}$, $Er^{+2}$, $Tm^{+2}$, $Yb^{+2}$, $Lu^{+2}$, $Ac^{+2}$, $Th^{+2}$, $Pa^{+2}$, $U^{+2}$, $Np^{+2}$, $Pu^{+2}$, $Am^{+2}$, $Cm^{+2}$, $Bk^{+2}$, $Cf^2$, $Es^{+2}$, $Fm^{+2}$, $Md^{+2}$, $No^{+2}$, $Lr^{+2}$, $In^{+3}$, $Sc^{+2}$, $Y^{+2}$, $Cr^{+3}$, $Sc^{+3}$, $Y^{+3}$, $V^{+3}$, $Nb^{+3}$, $Cr^{+3}$, $Mo^{+3}$, $W^{+2}$, $Mn^{+3}$, $Fe^{+3}$, $Ru^{+2}$, $Co^{+3}$, $Rh^{+3}$, $Ir^{+3}$, $Ni^{+3}$, and $Au^{+3}$; where X comprises at least one of the elements selected from the group consisting of $Si^{+4}$, $Ti^{+4}$, $Al^{+4}$, $Fe^{+3}$, $Cr^{+3}$, $Sc^{+3}$, $Y^{+3}$, $V^{+3}$, $Nb^{+3}$, $Cr^{+3}$, $Mo^{+3}$, $W^{+3}$, $Mn^{+3}$, $Fe^{+3}$, $Ru^{+3}$, $Co^{+3}$, $Rh^{+3}$, $Ir^{+3}$, $Ni^{+3}$, and $Au^{+3}$; and where O is oxygen.

Oxyapatite materials generally have the formula $$A_4B_6X_6O_{26} \quad (II)$$

where A comprises at least one of the elements selected from the group consisting of is $Ca^{+2}$, $Mg^{+2}$, $Fe^{+2}$, $Na^+$, $K^+$, $Gd^{+3}$, $Zr^{+4}$, $Hf^{+4}$, $Y^{+2}$, $Sc^{+2}$, $Sc^{+3}$, $In^{+3}$, $La^{+2}$, $Ce^{+2}$, $Pr^{+2}$, $Nd^{+2}$, $Pm^{+2}$, $Sm^{+2}$, $Eu^{+2}$, $Gd^{+2}$, $Tb^{+2}$, $Dy^{+2}$, $Ho^{+2}$, $Er^{+2}$, $Tm^{+2}$, $Yb^{+2}$, $Lu^{+2}$, $Sc^{+2}$, $Y^{+2}$, $Ti^{+2}$, $Zr^{+2}$, $Hf^{+2}$, $V^{+2}$, $Ta^{+2}$, $Cr^{+2}$, $W^{+2}$, $Mn^{+2}$, $Tc^{+2}$, $Re^{+2}$, $Fe^{+2}$, $Os^{+2}$, $Co^{+2}$, $Ir^{+2}$, $Ni^{+2}$, $Zn^{+2}$, and $Cd^{+2}$; where B comprises at least one of the elements selected from the group consisting of $Gd^{+3}$, $Y^{+2}$, $Sc^{+2}$, $In^{+3}$, $Zr^{+4}$, $Hf^{+4}$, $Cr^{+3}$, $Sc^{+3}$, $Y^{+3}$, $V^{+3}$, $Nb^{+3}$, $Cr^{+3}$, $Mo^{+3}$, $W^{+3}$, $Mn^{+3}$, $Fe^{+3}$, $Ru^{+3}$, $Co^{+3}$, $Rh^{+3}$, $Ir^{+3}$, $Ni^{+3}$, and $Au^{+3}$; where X comprises at least one of the elements selected from the group consisting of $Si^{+4}$, $Ti^{+4}$, $Al^{+4}$, $Cr^{+3}$, $Sc^{+3}$, $Y^{+3}$, $V^{+3}$, $Nb^{+3}$, $Cr^{+3}$, $Mo^{+3}$, $W^{+3}$, $Mn^{+3}$, $Fe^{+3}$, $Ru^{+3}$, $Co^{+3}$, $Rh^{+3}$, $Ir^{+3}$, $Ni^{+3}$, and $Au^{+3}$; and where O is oxygen.

The use of optional inert compounds can help make the resultant multilayer coating more resistant to undesirable penetration and/or reaction with materials that are present near the coating, such as molten sand, etc. Each of the first and second barrier layers 104 and 106 can have a compositional gradient such that the makeup of each coating layer 104 and 106 varies across its thickness from an inner dimension to an outer dimension. For example, the first barrier layer 104 can have a compositional gradient comprising a majority of a first rare earth stabilized zirconia material proximate the bond coat layer 102 to a majority of a second rare earth stabilized zirconia material away from the bond coat layer, with the first and second rare earth stabilized zirconia materials being different. A number of possible embodiments of the multilayer coating 100 are detailed below; however, those embodiments are provided merely by way of example and not limitation.

EXAMPLES

Tables 1-7 describe prophetic examples of coating compositions that can be made according to the present invention for application to a work piece. In each example, a gradient of coating materials within a given layer can be substantially linear. Moreover, each coating layer for each example can be applied using a plasma-based PVD process that can produce a columnar microstructure in layers of the coating as applied. In each of the Tables 1-7, the "Beginning wt %" designates weight percent of a given material at the beginning of application (i.e., at a location in a given coating layer closest to the parent material of the work piece), and "Ending wt %" designates weight percent of a given material at the end of application (i.e., at a location in the given coating layer further from the parent material of the work piece and from any previously-applied layer). Moreover, in the given examples, the bond layer, the first barrier layer and the second barrier layer can correspond to the layers 102, 104 and 106 described above with respect to FIG. 2. All given values are approximate, and specified materials can include incidental impurities.

TABLE 1

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 4-10 mol % Yttria-Stabilized Zirconia | 100 | 0 | 0.0127-0.254 (0.0005-0.010) |
|  | 25-40 mol % Lanthana-Stabilized Zirconia or 5-60 mol % Gadolinia-Stabilized Zirconia | 0 | 100 |  |
| 2nd Barrier | 4-10 mol % Yttria-Stabilized Zirconia | 0 | 100 | 0.0508-0.762 (0.002-0.030) |
|  | 25-40 mol % Lanthana-Stabilized Zirconia | 100 | 0 |  |

TABLE 2

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 4-10 mol % Yttria-Stabilized Zirconia | 100 | 0 | 0.0127-0.762 (0.0005-0.030) |
|  | 25-40 mol % Lanthana-Stabilized Zirconia or 5-60 mol % Gadolinia-Stabilized Zirconia | 0 | 100 |  |
| 2nd Barrier |  | None |  |  |

TABLE 3

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 4-10 mol % Yttria-Stabilized Zirconia | 0 | 100 | 0.0127-0.762 (0.0005-0.030) |
|  | 25-40 mol % Lanthana-Stabilized Zirconia or 5-60 mol % Gadolinia-Stabilized Zirconia | 100 | 0 |  |
| 2nd Barrier |  | None |  |  |

TABLE 4

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 4-10 mol % Yttria-Stabilized Zirconia | 100 | 0 | 0.0127-0.254 (0.0005-0.010) |
|  | 25-40 mol % Lanthana-Stabilized Zirconia or 5-60 mol % Gadolinia-Stabilized Zirconia | 0 | 100 |  |
| 2nd Barrier | 25-40 mol % Lanthana-Stabilized Zirconia or 5-60 mol % Gadolina-Stabilized Zirconia | 100 | 0 | 0.0508-0.762 (0.002-0.030) |
|  | 10-50 mol % Hafnia-Stabilized Zirconia | 0 | 100 |  |

TABLE 5

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 4-10 mol % Yttria-Stabilized Zirconia | 100 | 0 | 0.0127-0.254 (0.0005-0.010) |
|  | 25-40 mol % Lanthana-Stabilized Zirconia or 5-60 mol % | 0 | 80 |  |

TABLE 5-continued

| Layer | Material (all mol % values are approximate) | Beginning wt % | Ending wt % | Approximate Thickness Range in mm (in.) |
|---|---|---|---|---|
| | Gadolina-Stabilized Zirconia Garnet (e.g. Ca$_3$Gd$_2$Si$_3$O$_{12}$) | 0 | 20 | |
| 2nd Barrier | 4-10 mol % Yttria-Stabilized Zirconia | 0 | 0 | 0.0508-0.762 (0.002-0.030) |
| | 25-40 mol % Lathana-Stabilized Zirconia or 5-60 mol % Gadolina-Stabilized Zirconia | 80 | 0 | |
| | Garnet (e.g. Ca$_3$Gd$_2$Si$_3$O$_{12}$) | 20 | 100 | |

TABLE 6

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 4-10 mol % Yttria-Stabilized Zirconia | 100 | 0 | 0.0127-0.254 (0.0005-0.010) |
| | 25-40 mol % Lanthana-Stabilized Zirconia or 5-60 mol % Gadolina-Stabilized Zirconia | 0 | 80 | |
| | Oxyapatite (e.g. Ca$_3$Gd$_8$Si$_6$O$_{26}$) | 0 | 20 | |
| 2nd Barrier | 4-10 mol % Yttria-Stabilized Zirconia | 0 | 0 | 0.0508-0.762 (0.002-0.030) |
| | 25-40 mol % Lathana-Stabilized Zirconia or 5-60 mol % Gadolina-Stabilized Zirconia | 80 | 0 | |
| | Oxyapatite (e.g. Ca$_2$Gd$_8$Si$_6$O$_{26}$) | 20 | 100 | |

TABLE 7

| Layer | Material (all mol % values are approximate) | Beginning wt % | Ending wt % | Approximate Thickness Range in mm (in.) |
|---|---|---|---|---|
| Bond | MCrAlY | 100 | 100 | 0.0254-0.381 (0.001-0.015) |
| 1st Barrier | 5-60 mol % Gladolina-Stabilized Zirconia | 100 | 0 | 0.0127-0.762 (0.0005-0.030) |
| | Garnet (e.g. Ca$_3$Gd$_2$Si$_3$O$_{12}$) or Oxyapatite (e.g. Ca$_2$Gd$_8$Si$_6$O$_{26}$) | 0 | 100 | |
| 2nd Barrier | | None | | |

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, coatings according to the present invention can include additional layers or materials not specifically discussed above. Moreover, thicknesses of coating layers can vary as desired for particular applications, and can be greater or lesser than those indicated in the foregoing examples.

The invention claimed is:

1. A multilayer coating comprising:
    a bond coat layer;
    a first barrier layer applied on the bond coat layer, wherein the first barrier layer has a compositional gradient comprising (a) a majority of a first rare earth stabilized zirconia material proximate the bond coat layer to (b) a majority of a second rare earth stabilized zirconia material away from the bond coat layer, wherein the first and second rare earth stabilized zirconia materials are different;
    a second barrier layer applied on the first barrier layer, wherein the second barrier layer has a compositional gradient comprising (a) a majority of the second rare earth stabilized zirconia material and 0 wt % of a third rare earth stabilized zirconia material proximate the first barrier layer to (b) 0 wt % of the second rare earth stabilized zirconia material and 100 wt % of the third rare earth stabilized zirconia material away from the first barrier layer.

2. The multilayer coating of claim 1, wherein the first barrier layer has a compositional gradient comprising (a) 100 wt % of the first rare earth stabilized zirconia material and 0 wt % of the second rare earth stabilized zirconia material proximate the bond coat layer to (b) 0 wt % of the first rare earth stabilized zirconia material and at least approximately 80 wt % of the second rare earth stabilized zirconia material away from the bond coat layer.

3. The multilayer coating of claim 1, wherein the bond coat layer comprises a MCrAlY material where M is Ni, Co, Co/Ni or an aluminide material.

4. The multilayer coating of claim 1, wherein the bond coat layer comprises an aluminide material.

5. The multilayer coating of claim 1, wherein the compositional gradient of the first barrier layer transitions from (a) to (b) substantially linearly.

6. The multilayer coating of claim 1, wherein the first barrier layer has a columnar microstructure.

7. The multilayer coating of claim 1, wherein the first rare earth stabilized zirconia material comprises approximately 4-10 mol % yttria and the balance zirconia, plus incidental impurities.

8. The multilayer coating of claim 1, wherein the second rare earth stabilized zirconia material is selected from the group consisting of:
    (a) approximately 25-40 mol % lanthana and the balance zirconia, plus incidental impurities, and
    (b) approximately 5-60 mol % gadolinia and the balance zirconia, plus incidental impurities.

9. The multilayer coating of claim 1, wherein the second barrier layer has a compositional gradient comprising 100 wt % of the second rare earth stabilized zirconia material and 0 wt % of a third rare earth stabilized zirconia material proximate the first barrier layer.

10. The multilayer coating of claim 1, wherein the third rare earth stabilized zirconia material is selected from the group consisting of:
  (a) approximately 4-10 mol % yttria and the balance zirconia, plus incidental impurities, and
  (b) approximately 10-50 mol % halfnia and the balance zirconia, plus incidental impurities.

11. The multilayer coating of claim 1, wherein the second barrier layer has a thickness of approximately 0.0508-0.762 mm (0.002-0.030 in.).

12. The multilayer coating of claim 1, wherein the first barrier layer has a thickness of approximately 0.0127-0.762 mm (0.0005-0.030 in.).

13. The multilayer coating of claim 1, wherein the bond coat has a thickness of approximately 0.0254-0.381 mm (0.001-0.015 in.).

\* \* \* \* \*